United States Patent [19]

Shiotari et al.

[11] Patent Number: 4,688,070
[45] Date of Patent: Aug. 18, 1987

[54] SEMICONDUCTOR INTEGRATED CIRCUIT DEVICE

[75] Inventors: Yoshihisa Shiotari, Yokohama; Kenichi Nagao, Ayase, both of Japan

[73] Assignee: Kabushiki Kaisha Toshiba, Kawasaki, Japan

[21] Appl. No.: 613,302

[22] Filed: May 23, 1984

[30] Foreign Application Priority Data

May 24, 1983 [JP] Japan .................................. 58-91002
May 24, 1983 [JP] Japan .................................. 58-91003

[51] Int. Cl.$^4$ ........................................... H01L 27/02
[52] U.S. Cl. ........................................ 357/40; 357/45; 357/68
[58] Field of Search ....................... 357/68, 40, 45, 65, 357/71, 75, 80; 29/577; 361/403

[56] References Cited

U.S. PATENT DOCUMENTS 3,518,751 7/1970 Waters .................................. 29/577
3,839,781 10/1974 Russell .................................. 29/574
4,234,888 11/1980 Calhoun et al. ...................... 357/45

FOREIGN PATENT DOCUMENTS 0036148 4/1981 Japan .................................. 29/577 C
0078146 5/1982 Japan .................................. 29/577 C
0098938 6/1983 Japan ..................................... 357/45

OTHER PUBLICATIONS

IBM Technical Disclosure Bulletin vol. 13 #7 pp. 1927-1928 by Brickman Dec. 1970.
Patent Abstracts of Japan, vol. 7, No. 80 (E-168) [1225], 2nd Apr. 1983, & JP-A-58 7847 (Nippon K.K.) 17-0 1-83.
Electronic Design International, vol. 31, No. 6, Mar. 1983, pp. 173-178, Waseca, Minn., Denville, N.J., U.S.; N.J. Tangri, "Predesigned Building Blocks Quicken VLSI Design Pace".

Primary Examiner—Andrew J. James
Assistant Examiner—Mark Prenty
Attorney, Agent, or Firm—Finnegan, Henderson, Farabow, Garrett & Dunner

[57] ABSTRACT

A one-chip IC device has a plurality of IC-chip equivalent regions which have substantially the same patterns and functions as those of ICs whose functions are already evaluated and proven. The device has intra-region wiring layers in the IC-chip equivalent regions. The device also has external lead contacts which have been used as bonding pads of the original ICs, in addition to outer bonding pads. Second wiring layers are connected between the external lead contacts and between the external lead contacts and the outer bonding pads.

27 Claims, 7 Drawing Figures

SEMICONDUCTOR INTEGRATED CIRCUIT DEVICE

BACKGROUND OF THE INVENTION

The present invention relates to a large scale integrated device used in a computer such as a microcomputer.

A plurality of large scale integrated circuits (to be referred to as LSI for brevity hereafter) which have different independent functions are combined to constitute a system such as a microcomputer. In particular, LSI chips are prepared for a central processing unit for mainly performing arithmetic operations, a read-only memory and a random access memory which have memory functions, and peripheral devices such as a key input control section, a serial I/O section, a parallel I/O section, a counter timing control section, and a display drive section. These LSI chips are mounted on a printed wiring (circuit) board having a predetermined wiring pattern according to the circuit design, thereby electrically connecting the LSI chips to each other. In this manner, a semiconductor circuit system including a plurality of chips having different functions is prepared.

However, according to this conventional system, the wiring pattern often becomes complicated when it is formed on a board in accordance with a predetermined circuit design, resulting in time-consuming manufacturing and high cost. In addition, the electrostatic capacitance of the printed wiring board itself is high, so that signal transmission speed in the wiring pattern becomes low. Even if a high-speed chip having complementary MOS devices is used, high-speed operation of the semiconductor circuit system as a whole cannot be achieved, resulting in inconvenience. Furthermore, the conventional circuit system does not consist of a single chip, so breakdowns frequency occurs.

The above-mentioned drawbacks of the conventional semiconductor circuit system having a plurality of LSI chips on the printed wiring board can be overcome by providing a circuit system without using the printed wiring board. In this case, if known techniques are used, first, the system configuration must be redesigned to prepare a one-chip LSI having all the functions of the conventional LSIs, and second, the conventional chips must be sealed in a single package to constitute a hybrid integrated circuit. However, when redesigning is performed, the design and evaluation processes must be repeated to prepare a one-chip LSI although the conventional LSI chips have proven functions and electrical characteristics. Therefore, the redesigning scheme becomes useless. In addition, redesigning presents other problems such as design errors, a long-term design period and so on. Furthermore, hybrid integrated circuit manufacturing does not provide a good solution to the problem since a ceramic substrate is used in place of the printed wiring board. In practice, it is doubtful whether it is possible to mount the necessary number of chips in a package. Even if such a package is obtained, the manufacturing cost becomes considerably high.

SUMMARY OF THE INVENTION

It is an object of the present invention to overcome the drawbacks of a conventional semiconductor circuit system used in a microcomputer, or the like, and having a plurality of integrated circuits (to be referred to as ICs hereafter) on a printed wiring board.

It is another object of the present invention to provide a one-chip IC device constituted by a plurality of ICs whose functions are proven and estimated without using a printed wiring board.

In order to achieve the above objects of the present invention, ICs or LSIs having patterns already developed and proven, evaluated functions, are arranged on one semiconductor substrate. The bonding pads of these patterns are used as contacts (to be referred to as external lead contacts (or external terminals), hereinafter, such that a contact of a given pattern is connected as a pattern interconnecting contact to that of another pattern, and another contact of the given pattern is connected to an outer bonding pad which is newly designed.

According to the present invention, the IC device includes:

a plurality of IC-chip equivalent regions formed on a single semiconductor substrate and having substantially the same patterns and functions as ICs whose functions are already evaluated and proven, each of said IC-chip equivalent regions having external lead contacts, and a first wiring layer, i.e., an intra-region wiring layer;

a plurality of outer bonding pads formed on a region of said semiconductor subtrate which is located outside said IC-chip equivalent regions, said plurality of outer bonding pads being used as new bonding pads of a resultant IC device; and a second wiring layer connected between said external lead contacts and between said contacts and said outer bonding pads.

The second wiring layers may be formed in the process of forming the IC-chip equivalent regions, i.e., when the first wiring layers (to be referred to as intra-region wiring layers) have been formed in each of the IC-chip equivalent regions. In this case, the IC device according to the present invention can be prepared without changing the conventional process for fabricating an IC device and hence without adding a special step.

Alternatively, an insulating layer may be formed on the first wiring layer in each of the IC-chip equivalent regions, and the second wiring layer may then be formed thereon. In this case, extra space is not required for the second wiring layer, so that the chip size can be reduced.

According to the present invention, a plurality of ICs whose functions were evaluated and proven are formed as a single-chip device without using a printed wiring board. As a result, high-speed operation of the IC device as a whole can be performed, and high reliability can be provided.

A greater effect can be provided when the present invention is applied to an LSI.

DETAILED DESCRIPTION OF THE PREFERRED EMBODIMENTS

Figure 1:
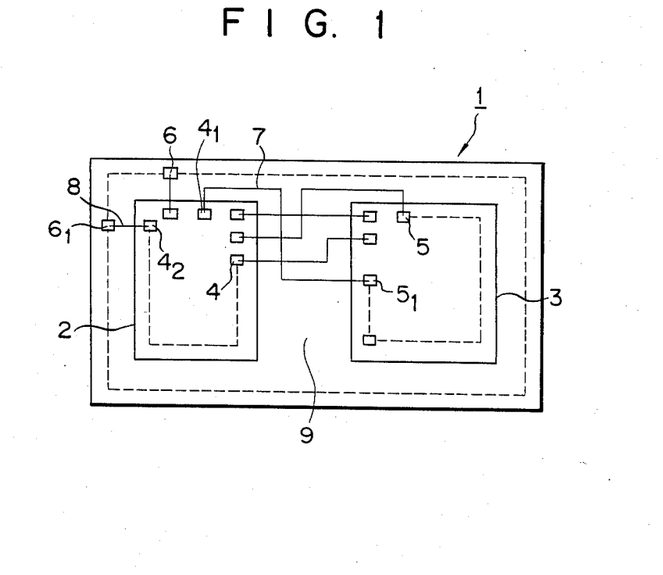
FIG. 1 is a schematic plan view of an LSI device according to a first embodiment of the present invention.

FIG. 1 shows an LSI chip 1 having two LSI-chip equivalent regions 2 and 3 according to a first embodiment of the present invention. The LSI-chip equivalent regions 2 and 3 have substantially the same patterns and functions as two LSIs which are separately prepared and which have evaluated and proven functions. Therefore, a plurality of external lead contacts 4 and 5, which are constituted by bonding pads originally used for connecting external regions with the LSI devices, and an intra-region wiring layer (not shown) are formed in each of the LSI-chip equivalent regions 2 and 3. In addition, a plurality of outer bonding pads 6 are formed in the peripheral portion of the chip 1 so as to connect the LSI devices with the external devices. Parts of the external lead contacts and the outer bonding pads are illustrated in FIG. 1. However, in practice, the necessary number of external lead contacts and outer bonding pads are formed in the peripheral portions of the LSI-chip equivalent regions 2 and 3 and in the peripheral portion of the chip 1. For example, an external lead contact $4_1$ in the chip equivalent region 2 is connected to an external lead contact $5_1$ in the chip equivalent region 3 through a second wiring layer 7 made of polysilicon or aluminum, so that the chip equivalent region 2 can exchange a signal with the chip equivalent region 3 through the second wiring layer 7. The second wiring layer 7 is a substitute for a printed wire in the conventional printed wiring board. In this embodiment, the second wiring layer 7 is formed in the process wherein the intra-region wiring layers (not shown) are formed in the chip equivalent regions 2 and 3. Therefore, the second wiring layer 7 cannot be formed inside the regions 2 and 3, and a wiring region 9 is required to form the second wiring layer 7 between the chip equivalent regions 2 and 3. In the same manner as the interconnection of the external lead wires $4_1$ and $5_1$, for example, an external lead contact $4_2$ in the chip equivalent region 2 is connected to an outer bonding pad $6_1$ through a second wiring layer 8 made of polysilicon or aluminum.

Figure 2:
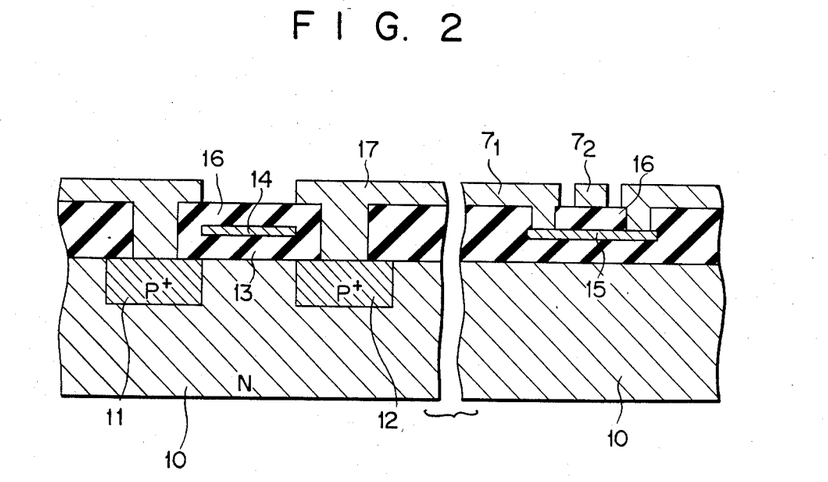
FIG. 2 is a sectional view showing part of the LSI device shown in FIG. 1.

The LSI chip according to the present invention can be prepared by using LSI patterns whose functions are already evaluated and proven. The manufacturing of the first embodiment will be exemplified by a MOS transistor and briefly described with reference to FIG. 2. Polysilicon is deposited on an oxide film 13 and is etched to give a predetermined pattern, thereby forming a gate electrode 14. In this case, when a second wiring layer (e.g., 7 in FIG. 1), which crosses two or more second wiring layers, is present in the wiring region 9, an intersection portion 15 is formed of polysilicon to prevent a short circuit in the process wherein the gate electrode 14 is formed. Thereafter, a p-type impurity is diffused in an n-type semiconductor substrate 10 to form a source 11 and a drain 12. And in a same manner, an n-type impurity is diffused although it is not illustrated in FIG. 2. After an oxide film 16 is formed to cover the entire surface, it is selectively etched to form a contact hole, and aluminum is deposited to cover the contact hole. The aluminum layer is selectively etched to give a predetermined pattern and to form an intra-region wiring layer 17, a second wiring layer $7_1$, and another second wiring layer $7_2$ which crosses the second wiring layer $7_1$, if required. The second wiring layer for connecting the external lead contacts and the outer bonding pads is simultaneously formed although it is not illustrated in FIG. 2.

A second embodiment of the present invention will now be described with reference to FIG. 5. The second embodiment includes a two-layer wiring structure wherein an insulating film is formed between the intra-region wiring layer of the chip and the second wiring layer.

Figure 5:
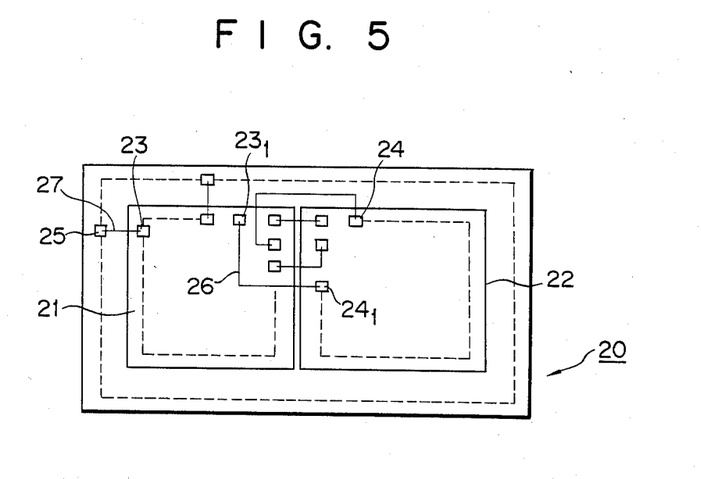
FIG. 5 is a schematic plan view of an LSI device according to a second embodiment of the present invention.

According to the second embodiment shown in FIG. 5, a single chip 20 has two chip equivalent regions 21 and 22 with substantially the same functions and patterns as those of the LSIs separately formed with already evaluated, proven functions. Each of the chip equivalent regions 21 and 22 has intra-region wiring layers (not shown) of the corresponding original LSI. A plurality of external lead contacts 23 and 24 constituted by the bonding pads of the original LSIs are formed in the peripheral portions of the chip equivalent regions 21 and 22, respectively. In addition, a plurality of outer bonding pads 25 are formed in the peripheral portion of the chip 20 so as to allow signal exchanges between the LSIs and their external devices. The external lead contacts 23 and 24 and the outer bonding pads 25 are generally formed of aluminum. A predetermined number of external lead contacts 23 and 24 and a predetermined number of outer bonding pads 25 are formed.

Several external lead contacts (e.g, $23_1$) in the chip equivalent region 21 are connected to the corresponding external lead contacts (e.g., $24_1$) through a second wiring layer 26 so as to exchange a signal therebetween. In the second embodiment, an oxide film is formed on the intra-region wiring layer which is regarded as a first aluminum layer. A second aluminum layer is formed on the oxide film to constitute the second wiring layer 26. The second wiring layer 26 can be formed on the chip equivalent regions 21 and 22. As a result, the special wiring region (9 in FIG. 1) required in the first embodiment can be omitted, thereby further reducing the chip size.

In this second embodiment, some of the external lead contacts 23 and 24 in the chip equivalent regions 21 and 22 are connected to the corresponding outer bonding pad 25 through another second wiring layer 27. The second wiring layer 27 is made of aluminum and can be formed in the process wherein the second aluminum layer is formed. When this chip 20 is mounted in a package, the outer bonding pads 25 are connected to the leads of the package.

Figure 3:
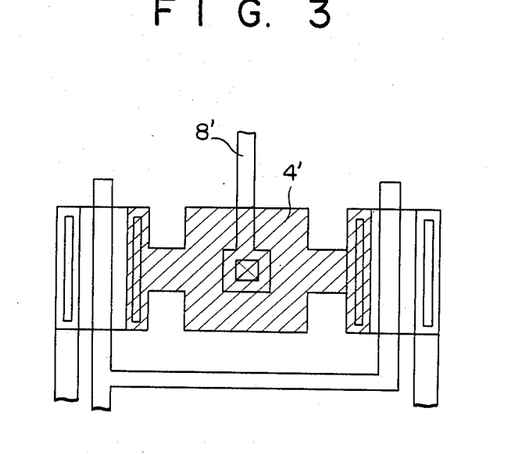
FIG. 3 is a partial plan view of a bonding pad of a conventional LSI chip when the bonding pad is used as an external lead contact without modification.
Figure 4:
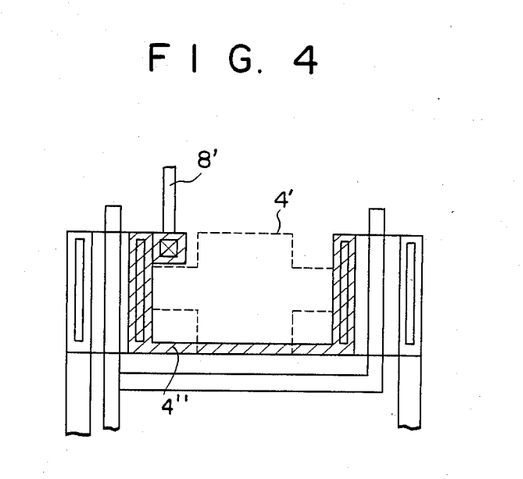
FIG. 4 is a partial plan view of an external lead contact which is formed by modifying a bonding pad of the conventional LSI chip.

According to the present invention, the original bonding pads of each of the LSI chips are used as the external lead contacts. In this case, the bonding pads can be used as the external lead contacts with/without modification. For example, as shown in FIG. 3, a portion 4' used as a bonding pad of a given LSI chip is used as the external lead contact without modification and can be connected to a second wiring layer 8' through a via-contact. In this case, the original pattern can be used without modification, so that a new LSI design can be easily produced. Alternatively, as shown in FIG. 4, a portion 4' (dotted portion) originally used as the bonding pad is modified to form an external lead contact 4"

(hatched portion) having a different shape to that of the portion 4'. In this case, the original bonding pad and its vicinity can be modified to decrease the size of the resultant chip.

The modification of the original bonding pads explained above can be applied to that of the above first embodiment. In this case, however, the portion 4' originally used as the bonding pad, the external lead contact 4", and the second wiring layer 8' are formed on the same plane and, therefore, the via-contact is eliminated.

Figure 6:
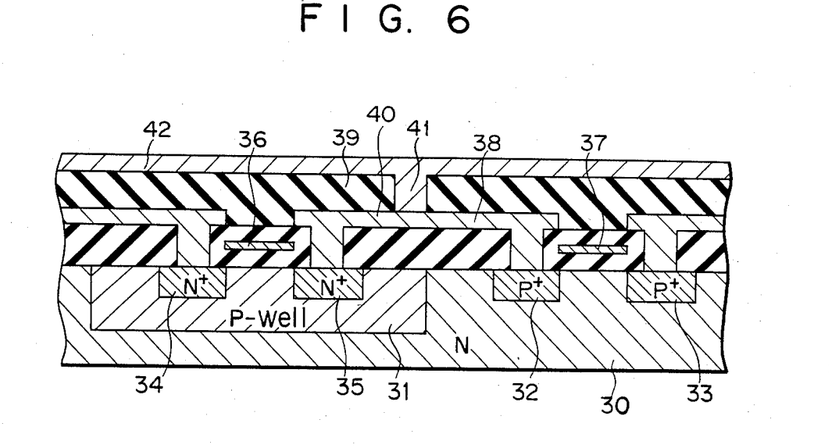
FIG. 6 is a sectional view showing part of the LSI device shown in FIG. 5.

A method of fabricating the LSI device according to the second embodiment will now be described with reference to FIG. 6. FIG. 6 shows a complementary MOSFET (to be referred to as a CMOSFET hereafter) as an example. The present invention can be effectively applied to mount the LSI device in one package with limited power consumption since the CMOS has a low power consumption.

Referring to FIG. 6, a p-type impurity is diffused in an n-type semiconductor substrate 30 in accordance with a known technique to form a p-well layer 31 for the n-channel transistor. Thereafter, a polysilicon layer is deposited by a known technique and is selectively etched to form gate electrodes 36 and 37 for the transistors of the CMOSFET. Then a p-type impurity is diffused in an n-type semiconductor substrate 30 by a known technique to form the p-channel transistor's source 33 and drain 32.

In a similar manner, the n-channel transistor's source 34 and drain 35 are formed in a said p-well. Subsequently, a first aluminum wiring layer 38, as an intra-region wiring layer, is formed by a known method. In addition, an insulating film 39 such as a silicon oxide film is deposited to cover the entire surface and is selectively etched by photoengraving to form a contact hole 41 so as to connect the external lead contact 40 to a second aluminum wiring layer 42 in the subsequent process. Finally, the second aluminum wiring layer 42 is formed to connect to the underlying layer (i.e., external lead contact 40) through the via-contact 41. The second aluminum wiring layer 42 corresponds to the second wiring layer 26 (FIG. 5) for connecting the external lead contacts 23 and 24 of the chip equivalent regions 21 and also 22, and corresponds to the second wiring layer 27 for connecting the external lead contacts 23 and 24 and the outer bonding pads 25. The second aluminum wiring layer 42 is thus used for signal exchange. The external lead contact 40 corresponds to that denoted by 23 or 24 in FIG. 5. It should be noted that the via-contact need not be formed on the external lead contact.

According to the second embodiment of the present invention, the second aluminum wiring layer can be formed on the first aluminum wiring layer, as the intra-region wiring layer, through the insulating interlayer. Therefore, unlike in the first embodiment, a special wiring region need not be provided, and the chip size can thus be reduced. In addition, since the first aluminum wiring layer does not cross the second aluminum wiring layer on the same plane, free circuit design can be performed. Furthermore, unlike in the first embodiment, polysilicon need not be used to constitute the intersection of the wiring layers. The electrical resistance of the intersection can be decreased, thereby preparing a high-speed LSI device.

Figure 7:
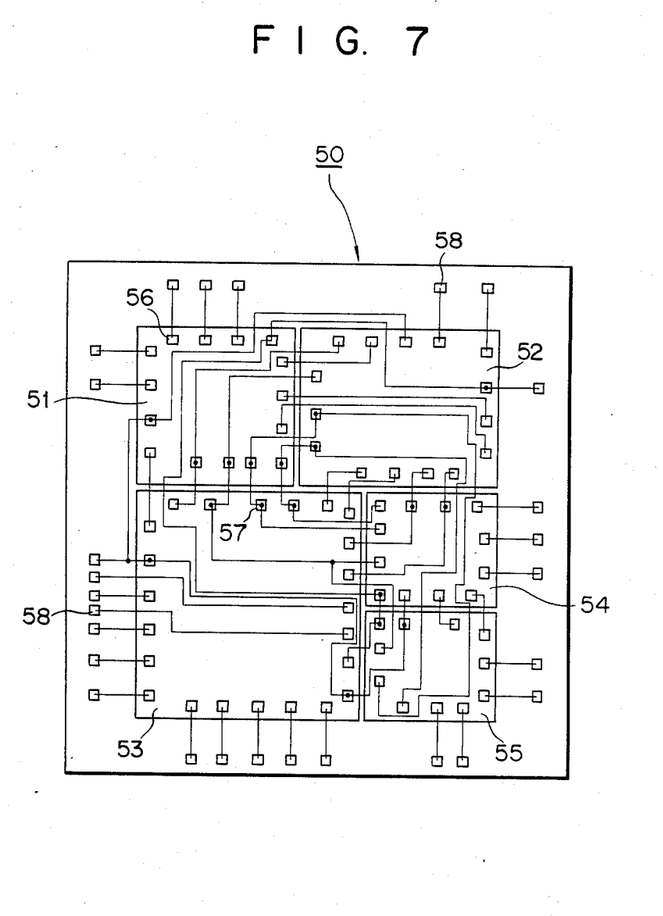
FIG. 7 is a schematic plan view of an LSI device having five LSI-chip equivalent regions according to a second embodiment of the invention.

FIG. 7 is a schematic plan view of an LSI device 50 which has the same construction as the device of the second embodiment and which can be suitably used in a microcomputer. In this application example, five chip equivalent regions 51, 52, 53, 54 and 55 are formed on a single semiconductor substrate. However, the number of the chip equivalent regions is not limited to five, but can change in accordance with the system configuration of the microcomputer. More than one identical chip equivalent regions may be formed. Each of the chip equivalent regions 51, 52, 53, 54 and 55 has substantially the same pattern as that of a corresponding LSI whose function is already evaluated and proven. In other words, a plurality of LSI patterns whose functions are evaluated and proven are electrophotographically printed on a single semiconductor substrate. It should be noted that the shape of the original bonding pads can change in a prescribed manner. Therefore, unlike the conventional LSI chip, the bonding pads of the original, separate chips are modified in shape and reduced in area to constitute external lead contacts (e.g., 56 and 57) in the chip equivalent regions 51, 52, 53, 54 and 55. In addition, bonding pads, i.e. outer pads 58 used for input/output signal exchange, are formed in a peripheral portion of the chip 50.

The present invention is not limited to the particular embodiments described above. Various changes and modifications which are obvious to those skilled in the art may be made within the spirit and scope of the present invention. For example, the present invention may be applied to an aluminum gate-type transistor, a tungsten gate-type transistor, and a molybdenum gate-type transistor, in addition to the silicon gate-type transistor described above. Furthermore, the wiring material is not limited to aluminum, but can be extended to tungsten, molybdenum, or the like. In either embodiment, the outer bonding pads are formed outside each chip equivalent region. However, if it is possible in the circuit design, the outer bonding pads may be formed on the external lead contacts of the chip equivalent regions through an insulating film. Furthermore, the second embodiment having a two-layer aluminum structure is disclosed above; however, a multilayer structure having three or more layers can be utilized.

The bonding pads of the original IC chip can be used as the external lead contacts. However, the external lead contact has at least an electrode function which allows signal exchanges within a resultant LSI and a function which allows circuit operation within the chip equivalent region. Therefore, the external lead contact need not have a large area like the original bonding pad. It is preferred that the original bonding pad is decreased in size to constitute the external lead contact.

What is claimed is:

1. A semiconductor integrated circuit device comprising:
    a single semiconductor substrate;
    a first integrated circuit region formed on said single semiconductor substrate having external terminals located at a periphery of said first integrated circuit region;
    a second integrated circuit region, having a different circuit function from said first integrated circuit region, also formed on said single semiconductor substrate and also having external terminals located at a periphery of said second integrated circuit region; and
    a plurality of outer bonding pads for connection to said first and second integrated circuit region external terminals also formed on said single semiconductor substrate outside of said first and second integrated circuit regions.

2. A device according to claim 1, wherein said first integrated circuit region comprises a central processing unit, and said second integrated circuit region comprises a memory or other peripheral circuit.

3. A device according to claim 1, wherein each of said first and second circuit regions comprises complementary metal oxide semiconductors.

4. A device according to claim 1, further including a first wiring layer and a second wiring layer, wherein a region of said second wiring layer connects said outer bonding pads to said external terminals and is located between said first and second integrated circuit regions.

5. A device according to claim 4, wherein said external terminals are formed co-planar with said first wiring layer, and said outer bonding pads are formed on an insulating interlayer which is formed on said first wiring layer.

6. A semiconductor integrated circuit device for providing the functions of two or more discrete integrated circuit chips, each of which have original bonding pads, comprising:
   a single semiconductor substrate;
   a first integrated circuit region formed on said single semiconductor substrate, having substantially the same pattern and function as said first integrated circuit chip, and having external terminals corresponding to said original bonding pads of said first integrated circuit chip;
   a second integrated circuit region formed on said single semiconductor substrate, having substantially the same pattern and function as said second integrated circuit chip, and having external terminals corresponding to said original bonding pads of said second integrated circuit chip, the function of said second integrated circuit region being different from that of said first integrated circuit region; and
   a plurality of outer bonding pads formed on a region of said semiconductor substrate which is located outside said integrated circuit regions, said plurality of outer bonding pads being used as bonding pads of a said semiconductor integrated circuit device.

7. A device according to claim 6, wherein said first integrated circuit region comprises a central processing unit, and said second integrated circuit region comprises a memory or other peripheral circuit.

8. A device according to claim 6, wherein each of said first and second circuit regions comprises complementary metal oxide semiconductors.

9. A device according to claim 6, further including a first wiring layer and a second wiring layer, wherein a region of said second wiring layer connects said outer bonding pads and is located between said first and second integrated circuit regions.

10. A device according to claim 9 wherein said external terminals are formed co-planar with said first wiring layer, and said outer bonding pads are formed on an insulating interlayer which is formed on said first wiring layer.

11. A semiconductor integrated circuit device comprising:
   a single semiconductor substrate;
   a first integrated circuit region formed on said single semiconductor substrate having external terminals located at a periphery of said first integrated circuit region;
   a second integrated circuit region having a different circuit function from said first integrated circuit region, also formed on said single semiconductor substrate and also having external terminals located at a periphery of said second integrated circuit region;
   a plurality of outer bonding pads for connection to said first and second integrated circuit region external terminals also formed on said single semiconductor substrate outside of said integrated circuit regions;
   a first wiring layer formed on each of said first and second integrated circuit regions; and
   a second wiring layer connecting one of said external terminals of said first integrated circuit region and one of said external terminals of said second integrated circuit region and also connecting one of said external terminals of said first or second integrated circuit regions and one of said outer bonding pads, said second wiring layer being formed on an insulating interlayer deposited on said first wiring layer in each of said first and second integrated circuit regions.

12. A device according to claim 11, wherein said first integrated circuit region comprises a central processing unit, and said second integrated circuit region comprises a memory or other peripheral circuit.

13. A device according to claim 11, wherein each of said first and second circuit regions comprise complementary metal oxide semiconductors.

14. A device according to claim 11, wherein the region of said second wiring layer which connects said external lead contacts is located between said first and second integrated circuit regions.

15. A device according to claim 11, wherein said external terminals are formed co-planar with said first wiring layer, and said outer bonding pads are formed on an insulating interlayer which is formed on said first wiring layer.

16. A semiconductor integrated circuit device for providing the functions of two or more discrete integrated circuit chips, each of which have original bonding pads, comprising:
   a single semiconductor substrate;
   a first integrated circuit region formed on said single semiconductor substrate having substantially the same pattern and function as said first integrated circuit chip, and having external terminals corresponding to said original bonding pads of said first integrated circuit chip;
   a second integrated circuit region formed on said single semiconductor substrate, having substantially the same pattern and function as said second integrated circuit chip, and having external terminals corresponding to said original bonding pads of said second integrated circuit chip, said function of said second integrated circuit region being different from that of said first integrated circuit region;
   a plurality of outer bonding pads formed on said semiconductor substrate located outside said integrated circuit regions, said plurality of outer bonding pads being used as bonding pads of said resultant semiconductor integrated circuit device;
   a first wiring layer formed on each of said first and second integrated circuit regions; and
   a second wiring layer connecting one of said external terminals of said first integrated circuit region and one of said external terminals of said second integrated circuit region and also connecting one of said external terminals of said first or second integrated circuit region and one of said outer bonding pads, said second wiring layer being formed on an insulating interlayer deposited on said first wiring layer in each of said first and second integrated circuit regions.

17. A device according to claim 16, wherein said first integrated circuit region comprises a central processing unit, and said second integrated circuit region comprises a memory or other peripheral circuit.

18. A device according to claim 16, wherein each of said first and second circuit regions comprise complementary metal oxide semiconductors.

19. A device according to claim 16, wherein the region of said second wiring layer which connects said external lead contacts is located between said first and second integrated circuit regions.

20. A device according to claim 16, wherein said external terminals are formed co-planar with said first wiring layer, and said outer bonding pads are formed on an insulating interlayer which is formed on said first wiring layer.

21. A method of fabricating semiconductor integrated circuit device, including the steps of:
    forming on a single semiconductor substrate first and second integrated circuit regions having substantially the same patterns and functions as those originally produced as a first and a second integrated circuit chips, at least one of the original bonding pads of said first and second integrated circuit chips being utilized as external terminals, and a first wiring layer being formed in each of said integrated circuit regions;
    forming a plurality of outer bonding pads on a region of said semiconductor substrate which is located outside said integrated circuit regions, said plurality of outer bonding pads being used as bonding pads of a resultant integrated circuit device; and
    forming a second wiring layer for making a connection between one of said external terminals of said first integrated circuit region and one of said external terminals of said second integrated circuit region and a connection between one of said external terminals and one of said outer bonding pads.

22. A method according to claim 21, further comprising the steps of forming an insulating film on said integrated circuit regions, and forming said second wiring layer on said insulating film.

23. A method according to claim 22, further comprising the step of forming said outer bonding pads on said insulating film simultaneously with the formation of said second wiring layer.

24. A semiconductor integrated circuit device, comprising:
    a single semiconductor substrate;
    a first integrated circuit region formed on said single semiconductor substrate having external terminals located at a periphery of said first integrated circuit region;
    a second integrated circuit region, having a different circuit function from said first integrated circuit region, also formed on said single semiconductor substrate and also having external terminals located at a periphery of said second semiconductor region;
    a plurality of outer bonding pads for connection to said first and second integrated circuit region external terminals, said bonding pads also formed on said single semiconductor substrate outside of said first and second integrated circuit regions; and
    said first and second integrated circuit regions being electrically connected to form said semiconductor integrated circuit device having a function different from that of said first integrated circuit and from that of said second integrated circuit.

25. A semiconductor integrated circuit device for providing the functions of two or more discrete integrated circuit chips, each of which have original bonding pads, comprising:
    a single semiconductor substrate;
    a first integrated circuit region formed on said single semiconductor substrate, having substantially the same pattern and function as said first integrated circuit chip, and having external terminals corresponding to said original bonding pads of said first integrated circuit chip;
    a second integrated circuit region formed on said single semiconductor substrate, having substantially the same pattern and function as said second integrated circuit chip, and having external terminals corresponding to said original bonding pads of said second integrated circuit chip, the function of said second integrated circuit region being different from that of said first integrated circuit region;
    a plurality of outer bonding pads formed on a region of said semiconductor substrate which is located outside said integrated circuit regions, said plurality of outer bonding pads being used as bonding pads of said semiconductor integrated circuit device; and
    said first and second integrated circuit regions being electrically connected to form said semiconductor integrated circuit device having a function different from that of said first integrated circuit and from that of said second integrated circuit.

26. A semiconductor integrated circuit device, comprising:
    a single semiconductor substrate;
    a first integrated circuit region, formed on said single semiconductor substrate, having external terminals located at a periphery of said first integrated circuit region;
    a second integrated circuit region, having a different circuit function from said first integrated circuit region, also formed on said single semiconductor substrate and also having external terminals located at a periphery of said second semiconductor region;
    a plurality of outer bonding pads for connection to said first and second integrated circuit region external terminals also formed on said single semiconductor substrate outside of said integrated circuit regions;
    a first wiring layer formed on each of said first and second integrated circuit regions;
    a second wiring layer connecting one of said external terminals of said first integrated circuit region and one of said external terminals of said second integrated circuit region and also connecting one of said external terminals of said first or second integrated circuit regions and one of said outer bonding pads, said second wiring layer being formed on an insulating interlayer deposited on said first wiring layer in each of said first and second integrated circuit regions; and said first and second integrated circuit regions electrically connected to form said semiconductor integrated circuit device having functions different from those of said second integrated circuit region.

27. A semiconductor integrated circuit device for providing the functions of two or more discrete integrated circuit chips, each of which have original bonding pads, comprising:

a single semiconductor substrate;

a first integrated circuit region formed on said single semiconductor substrate, having substantially the same pattern and function as said first integrated circuit chip, and having external terminals corresponding to said original bonding pads of said first integrated circuit chip;

a second integrated circuit region formed on said single semiconductor substrate, having substantially the same pattern and function as said second integrated circuit chip, and having external terminals corresponding to said original bonding pads of said second integrated circuit chip, the function of said second integrated circuit region being different from that of said first integrated circuit region;

a plurality of outer bonding pads formed on said semiconductor substrate, located outside said integrated circuit regions, said plurality of outer bonding pads being used as bonding pads of said semiconductor integrated circuit device;

a first wiring layer formed on each of said first and second integrated circuit regions;

a second wiring layer connecting one of said external terminals of said first integrated circuit region and one of said external terminals of said second integrated circuit region and also connecting one of said external terminals of said first or second integrated circuit regions and one of said outer bonding pads, said second wiring layer being formed on an insulating interlayer deposited on said first wiring layer in each of said first and second integrated circuit regions; and said first and second integrated circuit regions being electrically connected to form said semiconductor integrated circuit device having a function different from that of said first integrated circuit region and that of said second integrated circuit region.

* * * * *